United States Patent
Hamamura et al.

(10) Patent No.: US 8,406,581 B2
(45) Date of Patent: Mar. 26, 2013

(54) PHOTOELECTRIC COMPOSITE WIRING MODULE AND METHOD FOR MANUFACTURING SAME

(75) Inventors: Saori Hamamura, Kawasaki (JP); Naoki Matsushima, Chiba (JP); Madoka Minagawa, Yokohama (JP); Satoshi Kaneko, Yokohama (JP); Norio Chujo, Tokyo (JP); Yasunobu Matsuoka, Hachioji (JP); Toshiki Sugawara, Tokyo (JP); Tsutomu Kono, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/382,459

(22) PCT Filed: Jun. 2, 2010

(86) PCT No.: PCT/JP2010/003674
§ 371 (c)(1),
(2), (4) Date: Feb. 7, 2012

(87) PCT Pub. No.: WO2011/004545
PCT Pub. Date: Jan. 13, 2011

(65) Prior Publication Data
US 2012/0128292 A1    May 24, 2012

(30) Foreign Application Priority Data
Jul. 6, 2009  (JP) .................. 2009-159409

(51) Int. Cl.
*G02B 6/12* (2006.01)
(52) U.S. Cl. .......... 385/14; 385/129; 385/130; 385/131; 385/132
(58) Field of Classification Search .............. 385/14, 385/129–132
See application file for complete search history.

(56) References Cited

U.S. PATENT DOCUMENTS

| 2001/0010393 A1* | 8/2001 | Murakami ............ 257/684 |
| 2002/0061173 A1 | 5/2002 | Murata |
| 2006/0078248 A1 | 4/2006 | Sasaki et al. |
| 2011/0068467 A1* | 3/2011 | Ozaki .................. 257/737 |

FOREIGN PATENT DOCUMENTS

| JP | 2001-185752 A | 7/2001 |
| JP | 2001-290056 A | 10/2001 |
| JP | 2004-177521 A | 6/2004 |
| JP | 2006-133763 A | 5/2006 |

OTHER PUBLICATIONS

International Search Report including English translation dated Jun. 29, 2010 (Two (2) pages).

* cited by examiner

*Primary Examiner* — Brian Healy
*Assistant Examiner* — Guy Anderson
(74) *Attorney, Agent, or Firm* — Crowell & Moring LLP

(57) ABSTRACT

A photoelectric composite wiring module, being superior in performances and mass-productivity thereof, and a transmission apparatus of applying that therein are provided.
Optical devices 2a and 2b are disposed on a circuit board 1, so that they are optically coupled with optical guides 11 formed on the circuit board 1, wherein a filet-like resin is formed on a side surface of a bump, which is formed on side surfaces or/and upper portions of the optical devices, on an upper layer thereof being compressed a resin film to be adhered thereon, thereby forming an insulation film 31, and an electric wiring layer 3 is laminated, so that the electrodes of the optical devices 2 and wirings of the electric wiring layer are electrically connected with, and further thereon is mounted a semiconductor element 4; thereby obtaining the structure for bringing the transmission speed to be high per channel, and for preventing the power consumption from increasing. Also, it has the structure of not causing deterioration of the optical devices due to ill influences of moisture, thereby achieving high reliability. Further, it also produces an easy connecting method with a transmission apparatus, and high productivity thereof.

12 Claims, 12 Drawing Sheets

PHOTOELECTRIC COMPOSITE WIRING MODULE AND METHOD FOR MANUFACTURING SAME

TECHNICAL FIELD

The present invention relates to a photoelectric fusion wiring module for processing a large amount of optical signals, in bulk, which are transmitted within a transmission apparatus, and a manufacturing method thereof.

BACKGROUND OF THE INVENTION

In recent years, within a field if information communication, an equipment of communication traffic with using optical signals is under rapid development thereof, and until now, optical fiber networks are expanded, in a relatively long distance equal to or larger than several kilometers, such as, a trunk, a metro, an access system, for example. Hereafter, in a short distance, such as, between transmission apparatuses (several meters to several-hundred of meters), or within a transmission apparatus (several centimeter to several hundred centimeters), it is also effective to apply the optical signals for processing a large amount of data without a delay, and an opticalization is advanced on transmission between LSIs or between LSI-backplane in an inside of information equipment, such as, a router, a server, etc.

When building up an optical signal transmission structure, an importance lies in a connection portion between a photoelectric conversion element (an optical device) and an optical transmission path, such as, an optical guide or an optical fiber, etc. When transmitting a light from an light emitting element to an optical wiring or when entering a light transmitted from an optical transmission path, in order to achieve a fully effective photo-coupling, it is necessary to conduct positioning of the optical device and the optical transmission path at high accuracy. On the other hand, if taking a mass productivity or a practical use into the consideration, it is preferable that the optical coupling portion, as well as, the LSI to be applied in the information equipment, can be removed and/or exchanged, easily.

For example, in Japanese Patent Laying-Open No. 2006-133763 (Patent Document 1) is disclosed such structure that an optical device and an optical transmission path are coupled or connected with through positioning them with using guide pins, and the optical device and the LSI are mounted with using socket pins. With this, the optical device and the optical transmission path can be positioned, in relatively easy, and through mounting with using the socket pins, it is easy to remove the LSI.

PRIOR ART DOCUMENTS

Patent Documents

Patent Document 1: Japanese Patent Laying-Open No. 2006-133763 (2006).

BRIEF SUMMARY OF THE INVENTION

Problem(s) to be Dissolved by the Invention

However, with such structure as was mentioned above, there are generated the following problems. First of all, there is listed up an aspect that it is impossible to shorten the distance between the optical device and the LSI. With such structure, the optical device is disposed, not just below the LSI, but in an outside thereof. Accordingly, in order to transmit a signal to the optical device, it is necessary to connect between them with using electric wiring. If fastening a transmission velocity or speed of the signal from the LSI, however since this portion controls the speed, therefore it is impossible to obtain a sufficient transmission speed. Also, a loss is increased as the electric wiring is elongated, and as a result thereof, there is a possibility that electric power consumption goes up. And, it is also impossible to raise a density of mounting, fully, and this brings about a large-sizing of a board. Furthermore, there is a problem in an aspect of reliability. When trying to position the optical device and the optical transmission path at high accuracy, a large stress is applied on the coupling portion due to existence of considerable tolerances on each guide pin and each socket pin, and therefore it is expected that this deteriorates the reliability remarkably. Also, since no sealing is made on the optical device, therefore there is a possibility that the element receiving influences of moisture, etc., directly thereon, is deteriorated in the characteristics thereof.

An object of the present invention is to achieve the structure for bringing the distance between the LSI and the optical device as short as possible, thereby increasing the transmission speed for each channel, and also for reducing the electric power consumption to be small, and further to provide a photoelectric composite wiring module of high reliability, for enabling an easy removal of the LSI or the optical device, by taking a practicality thereof into the consideration, as well as, a transmission apparatus, applying the same therein, and a manufacturing method thereof.

Means for Dissolving the Problem(s)

For accomplishing the object mentioned above, according to the present invention, there is provided a photoelectric composite wiring module, comprising: an optical device; a semiconductor element; and a circuit board having electric wirings and optical guides thereon, to be connected with said optical device and said semiconductor element, wherein a liquid resin covering on a side surface of the optical device disposed on the circuit board is hardened, thereby obtaining a filet-like resin, for the purpose of achieving an optical coupling between an optical path formed on the circuit board, an insulating layer is formed by compressing a resin sheet on the optical device to adhere it thereon, and an electric wiring layer is formed on electrode pads of the optical device; thereby obtaining the structure for electrically connecting between the bumps and the electric wiring layer, i.e., the structure for mounting the semiconductor element on the electric wiring layer, so as to electrically connecting them.

Effect(s) of the Invention

According to the present invention, it is possible to connect between the semiconductor element and the optical device, electrically, through wiring of short distance; thereby, increasing the transmission speed per channel, and also preventing the power consumption thereof from increasing. Also, since forming of a gap can be avoided between the side surface of the optical device and the resin layer when forming the insulation layer, it is possible to prevent moisture, etc., from staying within the gap, i.e., an ill influence upon the optical device, such as, lowering the reliability of mounting, etc. Also, since the optical device can be fixed stably, it is possible to increase the reliability of mounting.

DETAILED DESCRIPTION OF THE PREFERRED EMBODIMENTS

Hereinafter, embodiments according to the present invention will be fully explained by referring to the attached drawings.

Embodiment 1

Figure 1:
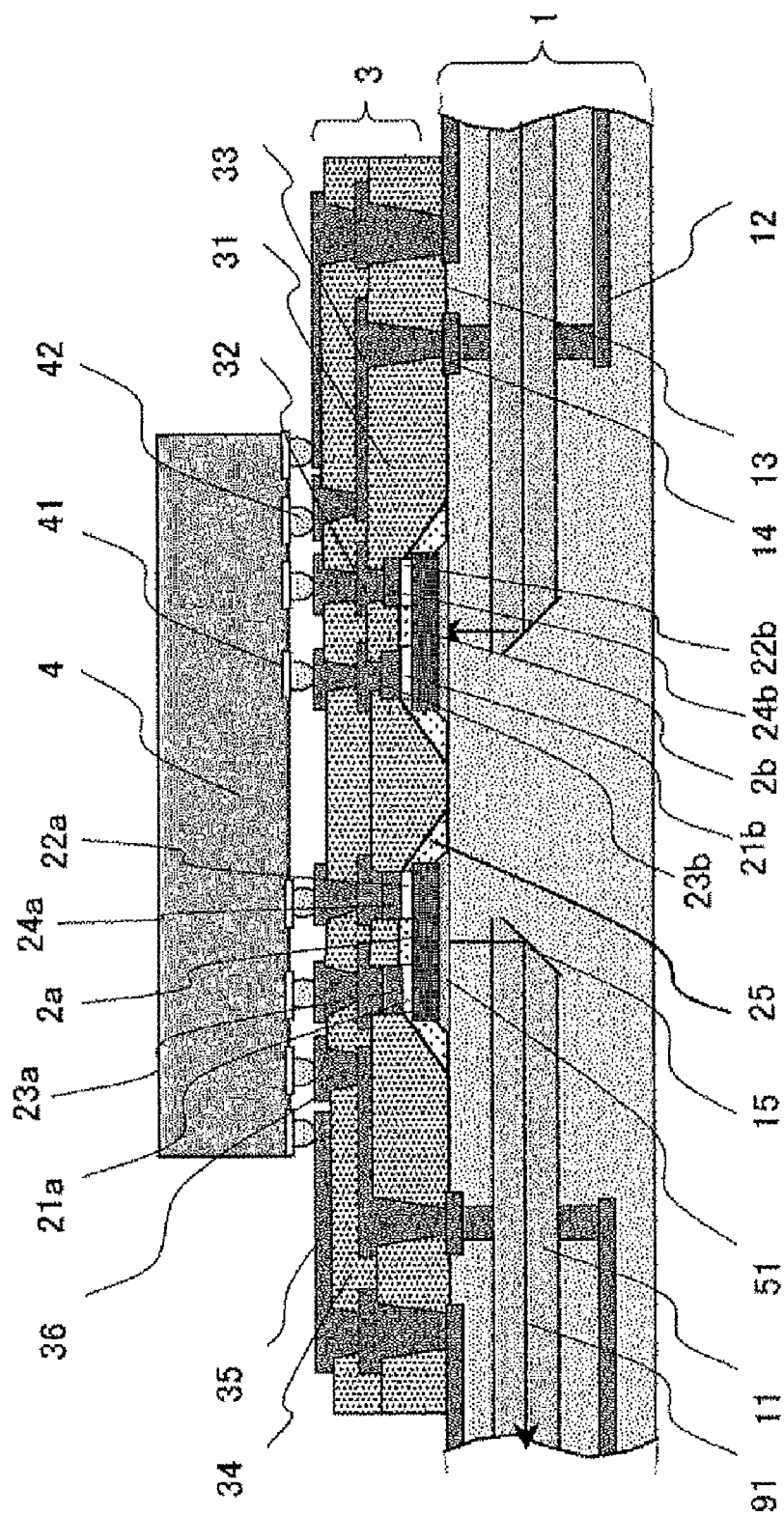
FIG. 1 is a schematic diagram for showing a first embodiment according to the present invention.

First of all, FIG. 1 shows a first embodiment of the present invention. This figure is a cross-section view of a photoelectric fusion wiring module according to the present invention. On a circuit board 1 is provided an optical guide 11 as a light transmission path, and also in an upper or a lower layer thereof is provided an electric wiring 12. On a surface layer 13 of the circuit board 1 is equipped an electrode pad 14, which is electrically connected with an electric wiring 12. An end portion 15 of the optical guide 11 is inclined by approximately 45°, i.e., having such structure that it can bend the direction of an optical signal by about 90°, upwards. According to the present embodiment, two (2) layers of the optical guides 11 are formed for increasing the mounding density; however may be a single (1) layer or three (3) layers or more than that.

Optical devices 2a and 2b are mounted on the surface layer 13 of the circuit board 1. In the present embodiment, the optical device 2a is a semiconductor laser (i.e., a light emitting element) of a surface emission type, while the optical device 2b is a photo diode (i.e., a light receiving element) of a surface incident type. The optical device 2a has a light emitting surface on a side portion facing to the circuit board 1, and the optical device 2b also has a light receiving surface on a side portion facing to the circuit board 1. Those optical devices 2a and 2b are preferable to be that of an array type, in which plural numbers of light emitting point/light receiving surface are integrated, judging from a viewpoint of the mounting density, but may be that having one (1) channel.

Figure 2:
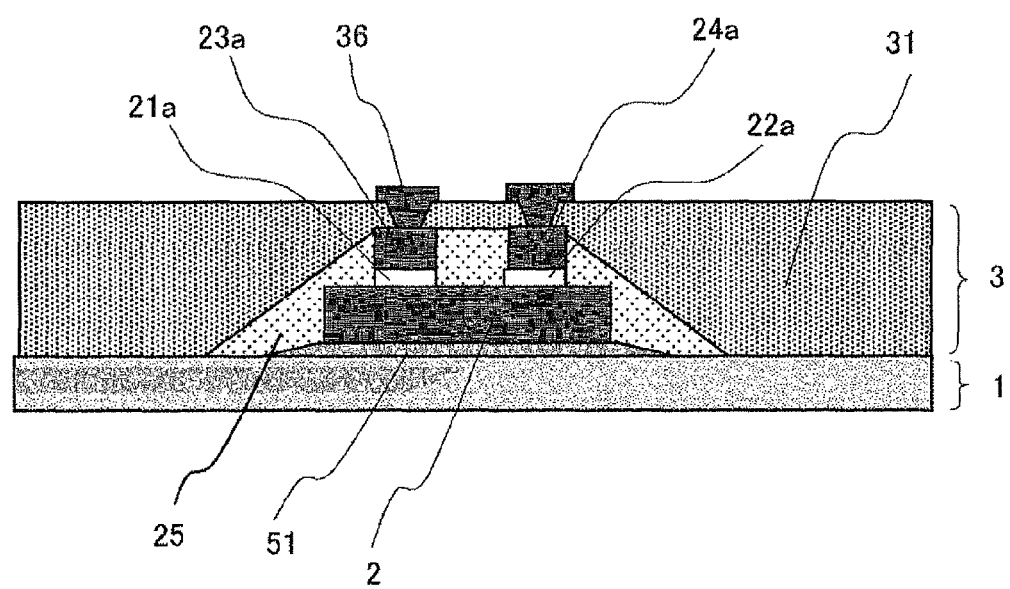
FIG. 2 is an enlarged view of an optical device, for showing the first embodiment according to the present invention.

FIG. 2 shows an enlarged cross-section view of a periphery portion of the optical device 2a. Electrodes 21a and 22a for running current to the optical device 2a are provided on the opposite to the circuit board 1 (on an upper side in the present figure), in the present embodiment. On those electrodes 21a and 22a are formed conductor bumps 23a and 24a, respectively. The bump is electrically connected with an electric wiring 31 of this film wiring layer 3, which is formed in an upper layer of that optical device 2a. On side walls of the optical device 2a and the bumps 23a and 24a is formed a filet-like resin 25. An insulation layer 31 on an upper layer of the optical device 2a is formed in such a form that the optical device is buried into an insulation sheet of B stage condition through a crimp contact (or pressure connection). In this instance, the filet-like resin 25 formed on the side walls of the optical device and the bumps achieve a roll or function of avoiding a hole or vacancy from being formed on the side walls of the optical device and the bumps, since the insulation sheet does not go and enter therein, completely, when crimping. With this, it is possible to provide a photoelectric mixture wiring module having high reliability.

As is shown in FIG. 1, the thin-film wiring layer 3 is built up with wiring layers 33 and 35, insulation layers 31 and 34 and plural numbers of electrode pads on a surface layer, including the insulation layer 31 formed on the insulation sheet of the B stage condition, being formed on upper layers of the optical devices 2a and 2b, and has such structure that it electrically connects each bump of the optical devices and the electrode pad 14 of the circuit board 1 to a surface layer electrode pad 36 through a via 32. On the thin-film wiring layer 3 is disposed the LSI 4. On the LSI 4 are provided plural numbers of electrode pads 41, and those electrode pads 41 and the electrode pads 36 of the thin-film wiring layer are electrically connected with, respectively, through bumps 42. The bumps 42 may be solder balls, stand bumps of Au, or bumps made of plating, etc. On the LSI 4 are integrated a driver circuit for use of a semiconductor laser and an amplifier circuit for use of a photo diode, according to the present embodiment. Of course, it does not matter if the LSI and those driver/amplifier circuits are constructed to be independent from. In the present embodiment, the optical devices 2a and 2b are disposed just below the LSI 4, i.e., within a projection surface of the LSI 4 projected on the circuit board 1, so as to make the distance from the optical device 2 up to the LSI 4 small, and thereby enlarging the transmission speed while lowering the electric power consumption. Also, since the distance for wiring is short, manufacturing thereof comes to be easy.

Figure 3A:
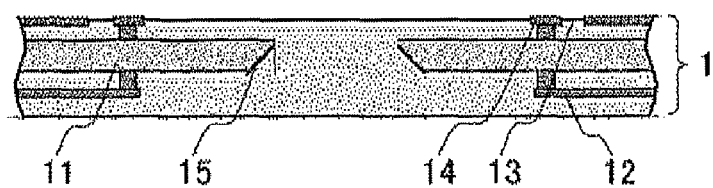
FIGS. 3A-3G are views for showing a manufacturing method about the first embodiment according to the present invention.
Figure 3B:
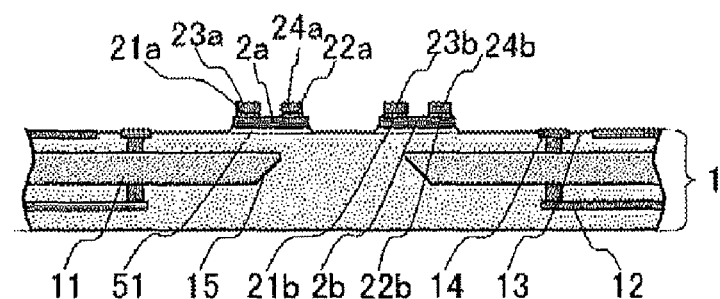
Figure 3C:
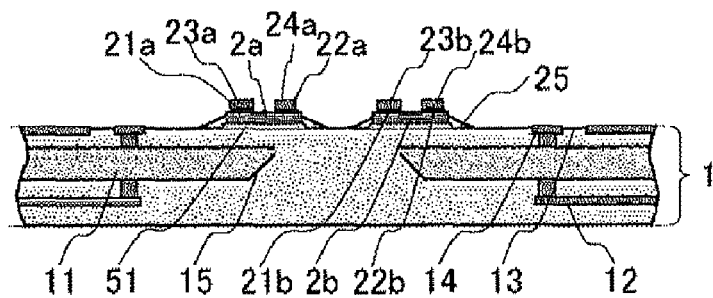

Next, explanation will be given on an example of the manufacturing method of that shown in FIGS. 1 and 2, by referring to FIGS. 3A to 3G. First of all, FIG. 3A is a view for showing the circuit board 1 having two (2) pieces of optical guides 11, the electric wirings 12 and the electrode pads 14. On the surface layer 13 of this are mounted the optical devices 2 to be optically coupled with the optical guides 15 (FIG. 3B). As a means for bonding the optical device 2, an adhesive 51 is used, in the present embodiment, being transparent with respect to the wavelength of the light, which the optical device 2 emits or receives. As a method for applying the adhesive 51, although there is applied a method of transcribing the adhesive before fastening on a bonding surface of the optical device 2, and under that condition, mounting it on the board 1; however, it does not matter to adopt a method of dripping the adhesive on the board. When mounting the optical device 2, for optically coupling the optical guide 15 and the optical device 2, effectively, it is necessary to fit the position thereof to an end portion of the optical guide 15. Accordingly, as a mounting apparatus (i.e., a mounter or a bonder) for the optical device, there is applied an apparatus, which can maintain a necessary mounting accuracy. If applying the optical device of an array-type, since the light emitting point or the light receiving surface increases, the mounting accuracy is turned into a severe direction; however, the position shift between the light emitting points/the light receiving surfaces is small to be neglected, since they are formed collectively in a wafer process, and also regarding the end portions between the optical guides, the position shifts thereof are similarly small, since they are formed collectively through the photolithography, etc., therefore, substantially it is possible to implement them with the mounting accuracy almost similar to that of a one (1) channel article. Also, the optical device and the optical guide can be coupled, optically, at high coupling efficiency, since they are optically coupled with only on an upper clad portion of the optical guide, or through the distance of a resin layer formed on the surface layer thereof, i.e., through several to several tens μm.

Figure 7:
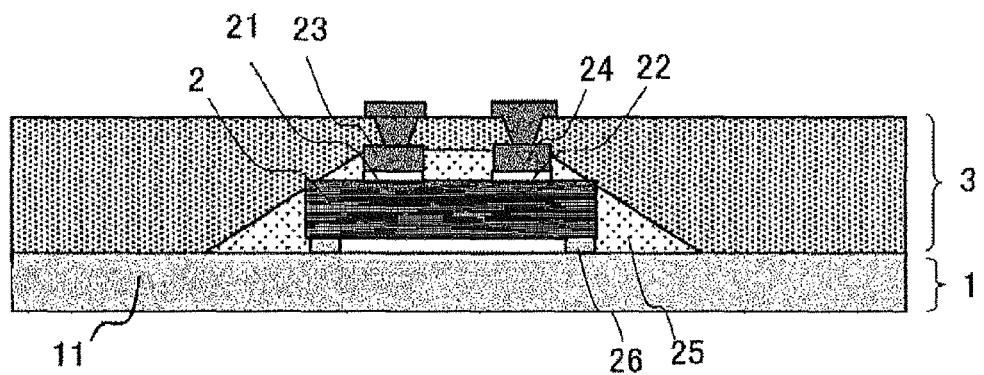
FIG. 7 is a schematic diagram for showing a third embodiment according to the present invention.

Further, in relation to a method for fixing the optical device, an opaque adhesive may be applied if it does not disturb the optical path. Also, if it is possible to form a metalized layer on a side of the circuit board of the optical device, a solder bonding may be applied, as is shown in FIG. 7. In this instance, of course, it is necessary to make the solder does not disturb the optical path. Also, if possible to form the solder to surround an entire periphery of the light emitting point/the light receiving point, it is possible to avoid an invasion of a material, which disturbs the optical path.

Next, on the electrode pads 21 and 22 of the optical devices 2 are formed the bumps 23 and 24. In the present embodiment, the stud bumps 23 and 24 of Au are formed with applying a bump bonder. After forming the studs, leveling is conducted so that each of the bumps 23 and 24 comes to be almost equal to in the height thereof. As a method for forming the bumps, other than that mentioned above, there may be applied that with using plating, for example. Regarding an order of forming the bumps, not after mounting the optical devices 2 on the board 1, as in the present embodiment, but they may be implemented when they are under the condition as a single body of the optical device or at the level of a wafer.

Next, filet-like resins 25 are formed on side surfaces of the optical devices 2 and the bumps 23 and 24. Firstly, a resin under the liquid condition is dropped so that it is applied on the side surfaces of the optical devices 2 and the bumps 23 and 24 with using a dispenser, and the resins 25 are hardened through heating, etc. With doing this, the resins 25 are formed in a filet-like shape, as is shown in the figure. Condition to be required for the resin is that it adheres on an electronic circuit board, closely, so that on the side surface is formed no hole or vacancy, in which no moisture can stay. Further, in order to prevent an excessive stress from being applied onto the optical device 2, it is preferable to have a small Young's modulus of elasticity. Since it is possible to prevent the adhesive or the like from invading into a gap between the optical device 2 and the circuit board 1, the resin 25 may be opaque with respect to the light. In more details, it is preferable to apply that having either one of a silicon of methyl group, a silicon of phenyl group, and a hybrid resin of silicon and epoxy, as a main component thereof.

Figure 3D:
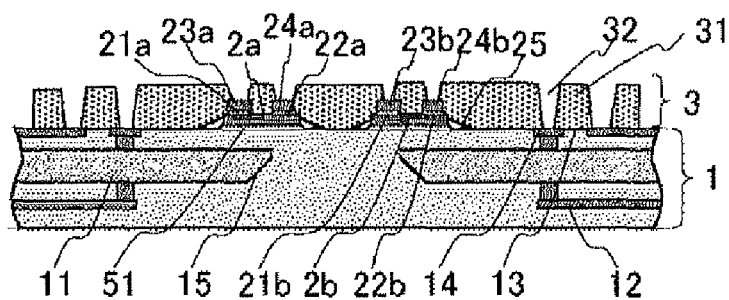

Next, on an upper layer of the optical devices 2 is compressed an insulation film under the B stage condition to be adhered (i.e., contact bonding). The B stage condition means an intermediate stage of reaction in thermoset or thermocurable resin, in other words, it is a stage that, although the material is softened due to heading, it does not fuse or dissolve, completely, even in contact with a certain kind of liquid. Then, as is shown in FIG. 3D, the optical devices are in the condition of being buried within the insulation layer. In this instance, because of existence of the filet-like resins on the side surfaces of the optical devices and the bumps, it is possible to prevent the holes or vacancies from being formed in periphery of the sidewalls of the optical devices and the bumps when compressing them to adhere (i.e., contact boding). If the hole or vacancy is formed, there is a possibility that the moisture is accumulated in the hole or vacancy during when an apparatus is used, and it gives an ill influence upon the characteristics of the optical devices. Thus, with applying the structure according to the present invention, it is possible to provide a photoelectric composite wiring module having high reliability.

As the insulation sheet of the B stage condition is preferable a polyamide-imide resin or a polyimide resin. In more details, KS6600 of Hitachi Chemical Co. Ltd., and LPN-1400 of Toray Industries, Inc. are available. Since the LPN-1400 of Toray Industries, Inc. has photosensitivity, it widens the width of the method into forming a pattern after the compressing to adhere (i.e., the contact boding).

After compressing the insulation layer 31 to adhere (i.e., the contact boding), the wiring layer 3 is formed. According to the present embodiment, with applying a photosensitive resin as the insulating layer 31, through-holes 32 are formed in the insulation layer 31 through a photolithographic process. Thereafter, through a heading process, the resin is hardened or cured, fully, through a heating process. Thereafter, conductors 33 are formed through a process, such as, plating or the like, within the through-holes 32. In this instance, the electric wiring layer 3 may be formed on the upper layer thereof, at the same time, through the plating.

As other method for forming the through-holes 32 is a forming by grinding. After pressing the insulation layer 31 to adhere and hardening it fully, the insulation layer 31 is grinded to be flat from an upper layer thereof with applying a grinding process, such as, polishing, etc. If finishing the grinding when the bumps formed on the optical devices appear on a surface, the bumps of the optical devices come to the through-holes.

Figure 3E:
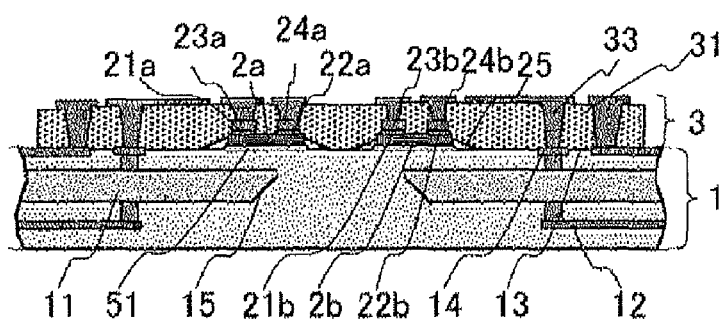

Next, the wiring layer 33 is formed. For filling up the via/forming the wiring, an electroplating is applied. Hereinafter, though not shown in the figure, explanation will be given on a method for forming the wiring layer through the electroplating. First of all, a seed film is formed covering over an entire surface of the board through spattering. The composition of the seed film has a laminated structure of an adhesive layer of Cr and a layer of Cu. Next, the electroplating of Cu is treated so as to filling up the via-holes. In the present embodiment, the via has the structure of a field via, however it may be that having the structure of a conformal type having no conductor at the central portion thereof. Also, regarding a method for forming the wiring layer, it may be one, not applying the plating, but only the thin-film deposition through spattering. With this, the Cu film is formed covering over an entire surface of the board. Next, separation of the wiring patterns is conducted through the photolithography, and this results into such structure as shown in FIG. 3E.

Figure 3F:
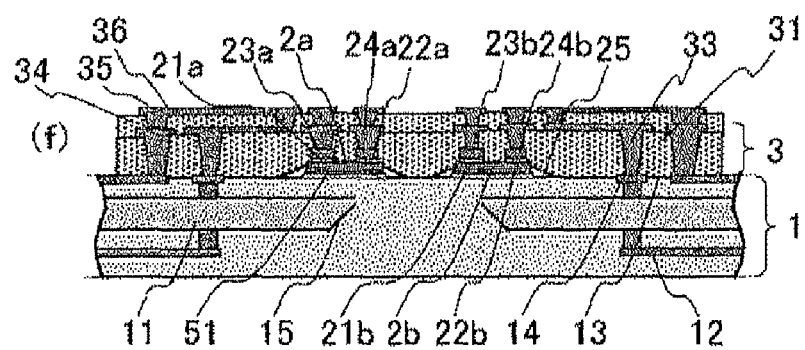

Further, with forming the insulation layer and the wiring layer on this, the wiring layer 3 is completed (FIG. 3F). On the uppermost layer is formed the electrode pads 36 with using a material fitting to the bumps for connecting the LSI thereon. In the present embodiment, although not shown in the figure, a Ni/Au film is formed as an electrode for use of solder connection. However, in the present embodiment, although the thin-film wiring layer 3 has two (2) layers, but it may have one (1) layer or three (3) layers or more than that, depending on the LSI, the optical devices and/or the configurations between the circuit board 1 and the electric wiring. Also, regarding the method for forming the thins-film wiring layer 3, it does not matter to apply other method(s) than that of the present embodiment.

Figure 3G:
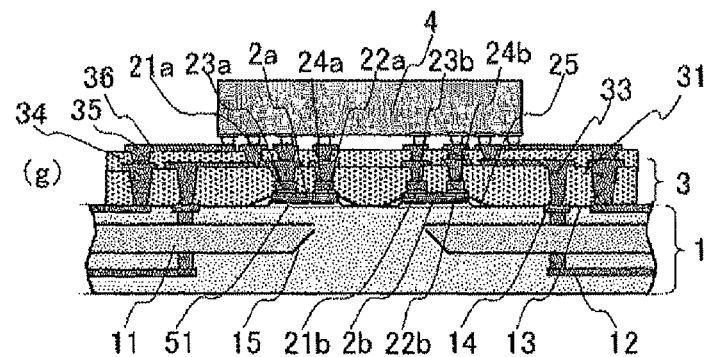

Finally, the LSI 4 is mounted on the thin-film wiring layer 3 (FIG. 3G). In the present embodiment is applied the LSI 4 integrating the driver circuits for the semiconductor diodes and the amplifier circuits for the photo diodes therein. As a method for bonding is executed a reflow bonging after mounting the LSI thereon, with using the bumps made of a solder of Sn group. Regarding the LSI 4, as was mentioned previously, it may be that mounting the driver circuits and/or the amplifier circuits, separately, independent therefrom, respectively. Also, regarding the method for bonding the bumps, it does not matter to apply other method (s), for example, an ultrasonic bonding with an aid of Au bumps, a bonding with an aid of Au bumps and solder, and further solder bonding after forming plating bumps, etc. A merit of applying the method of solder bump boding lies in an aspect that the LSI can be removed or exchanged, easily, with increasing temperature to be equal or higher than melting point of solder.

Figure 4:
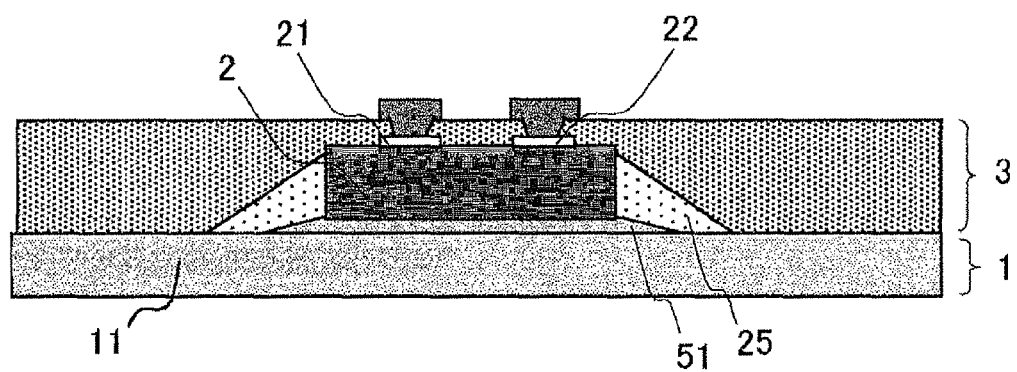
FIG. 4 is a schematic diagram for showing the first embodiment according to the present invention.

Further, although such structure is adopted in the present embodiment, that the resin is applied on both the side surfaces of the optical devices and the bumps, while forming bumps on the optical devices 2; however, it does not matter to adopt such structure, that the resin 25 is applied only on the side surfaces of the optical devices 2, with applying such an electrode pad structure, as is shown in FIG. 4.

As a means for increasing mass-productivity of the photoelectric fusion wiring module according to the present invention, there is a means of giving redundancy. In more details, it means to comprise a number of combinations of the optical device and the optical guide by a number thereof, larger than that they are actually used. If a defect is generated on the thin-film wiring for connecting between the optical devices and the LSI, or a defect is generated in the optical device and/or the LSI, there are used the wiring/optical device/optical guide, which are prepared as spares. If they are formed without a deficiency, the spare circuit (s) is/are under the condition that it/they cannot be used, in a sense of circuitry or physically.

Embodiment 2

Figure 5:
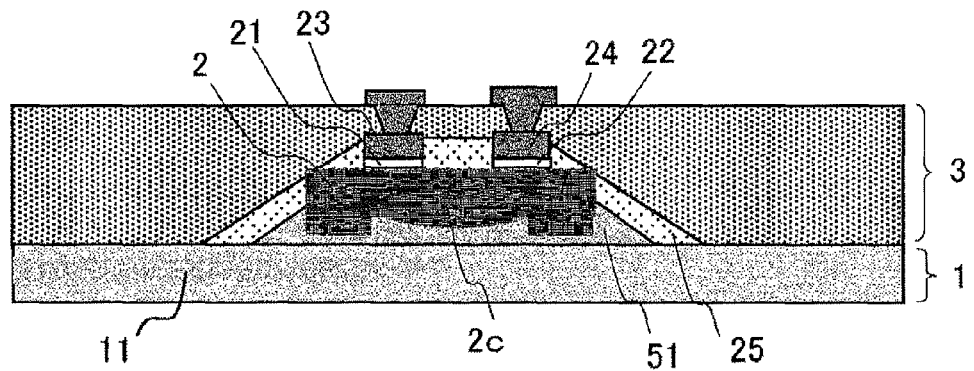
FIG. 5 is a schematic diagram for showing a second embodiment according to the present invention.

Next, explanation will be given on a second embodiment according to the present invention, by referring to FIG. 5. The difference between those shown FIG. 5 and FIG. 2 lies in that a lens 2c is mounted on the optical device 2. The purpose of mounting the lens 2c on the optical device lies to focus the light beams, and thereby to increase an efficiency of optical coupling between the optical device 2 and the optical guide 11. The specification of the lens 2c is determined depending on the difference between a refractive index of a medium of the lens and that of a medium of portion contacting on a surface of the lens. Accordingly, the specification of the lens 2c is changed depending on selection of the mediums for the lens and for the surface of the electronic circuit board. In the present embodiment, the electronic circuit board has such structure that there is provided a transparent resin (e.g., the adhesive) similar to that in the embodiment 1 on the surface thereof. Design is made upon basis of the refractive index (n=1.4) of this resin, so that it has desired characteristics. If mounting the lens not in contact with the resin, the lens design may be made by assuming that the medium is an air (refractive index n=1), so as to obtain the desired characteristics. The processes thereafter are similar to those in the embodiment 1. With this, it is possible to provide the photoelectric fusion wiring module, having high reliability and being high in the productivity thereof, and also being superior in the efficiency of optical coupling. High efficiency of the optical coupling brings about a merit of reducing driving current of the optical devices, and also effects, such as, power-saving and prevention of global warming.

Figure 6:
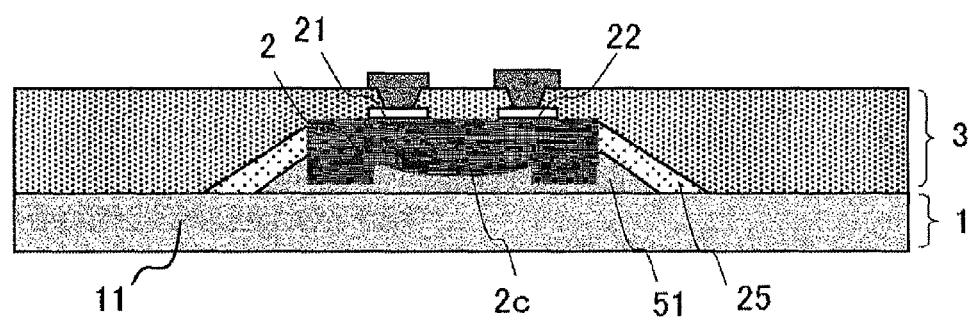
FIG. 6 is a schematic diagram for showing a second embodiment according to the present invention.

However, although such structure is adopted, in the present embodiment, that the resin 25 is applied on both the side surfaces of the optical devices 2 and the bumps 24, while forming the bumps 24 are on the optical devices 2; however, it does not matter to adopt such structure that the electrode pad has no bump as is shown in FIG. 6, and that the resin 25 is applied only on the side surfaces of the optical devices 2, similar to that shown in the embodiment 1.

Embodiment 3

Next, explanation will be given on a third embodiment, according to the present invention, by referring to FIG. 7. The difference between those shown FIG. 7 and FIG. 2 lies in that the optical devices are mounted on the circuit board through the solder. With using the solder, there is a necessity of forming a metalizing of Au or the like, on surfaces of the electronic circuit board contacting with the optical devices. Also, since the solder of course does not transmit the light therethrough, the solder is so formed that it does not cover portion where the light beams pass through. The metalizing is formed on an entire of outer periphery of the surfaces of the electronic circuit board contacting with the optical devices.

If forming the metalizing on the entire of the outer periphery of the surfaces of the electronic circuit board contacting with the optical devices, and also mounting them on the electronic circuit board with using the solder enable sealing up the light emitting/light receiving portions thereof, completely, since it is possible to prevent the resin from entering into the light emitting/light receiving portions, when dropping the resin on the side surfaces of the optical devices thereafter, and therefore it is preferable. The processes thereafter are similar to those in the embodiment 1.

Figure 8:
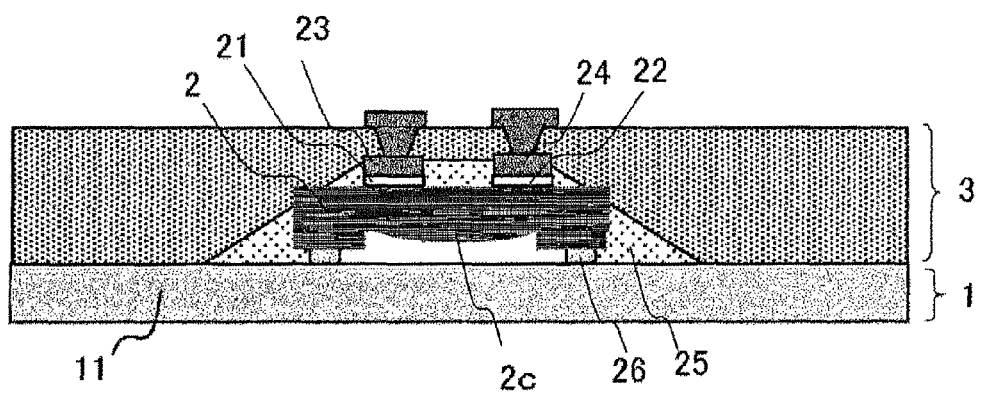
FIG. 8 is a schematic diagram for showing the third embodiment according to the present invention.

Mounting with using the solder can be applied to the optical device having the lens. The configuration of that is shown in FIG. 8. Similar to that shown in FIG. 7, since forming the metalizing in an outer periphery of a surface, where the optical device faces to the electronic circuit, as well as, bonding it with using the solder, bring about an air layer between the lens and the surface of the electronic circuit board, then it is enough to apply a lens, which is designed depending on this. Even during when dropping the resin thereafter, there is no possibility that the resin reaches to the lens surface, and therefore it is possible to provide the photoelectric mixture mounting wiring module having high productivity. The processes thereafter are similar to those in the embodiment 1.

Figure 9:
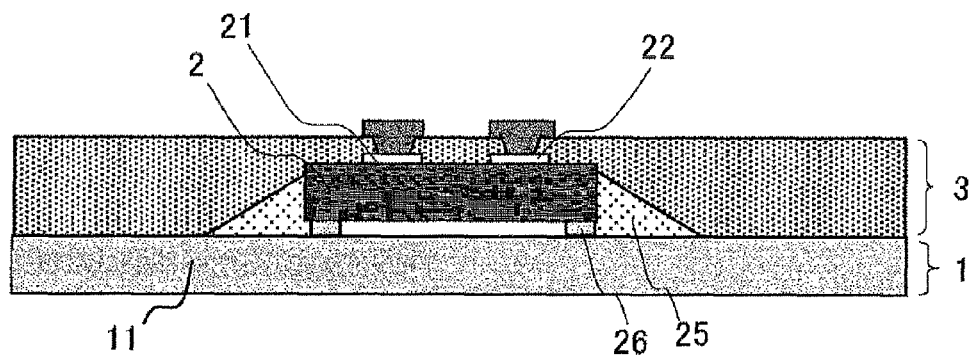
FIG. 9 is a schematic diagram for showing the third embodiment according to the present invention.
Figure 10:
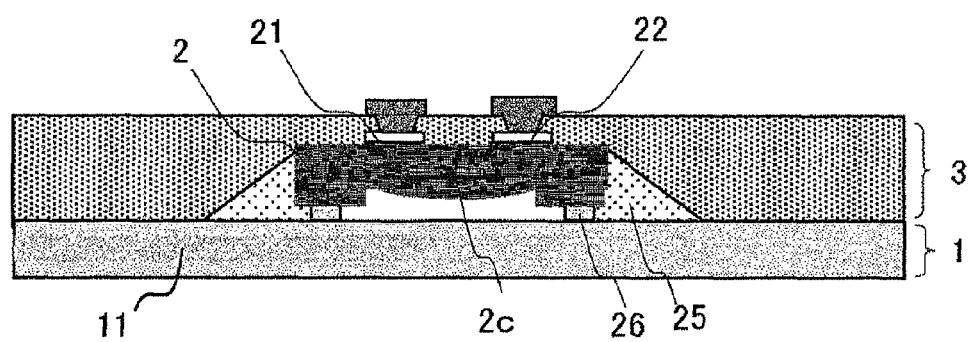
FIG. 10 is a schematic diagram for showing the third embodiment according to the present invention.

In relation to the present embodiment, it also does not matter to adopt such structure, that the electrode pad has no bump and that the resin is applied only on the side surfaces of the optical devices, as is shown in FIGS. 9 and 10. Also, an adhesive is provided on an outer periphery of the optical device, in the place of the metalizing, so as to form the air layer between the optical device and the circuit board.

Embodiment 4

Next, explanation will be given on a fourth embodiment, according to the present invention, by referring to FIG. 11.

Figure 11:
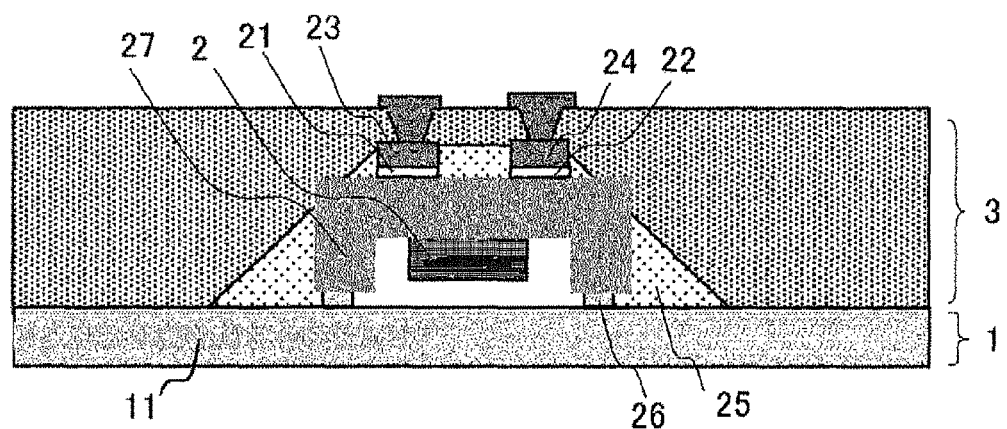
FIG. 11 is a schematic diagram for showing a fourth embodiment according to the present invention.

The difference between that shown FIG. 11 and the embodiment 1 shown FIG. 2 lies in that the optical devices 2 are mounted on a sub-mount 27, and that they are mounted on the circuit board 11 through the sub-mount 27 with using the solder 26. The sub-mount 27 is formed of aluminum nitride (AlN), for example. The sub-mount 27 has a recess (or, in "U" shaped), and the optical device 2 is mounted into the recess portion. Firstly, the optical devices 2 are mounted into the recess portions. As a method for mounting is applied Au—Sn solder. With this mounting, the optical devices 2 are fixed on the sub-mount 27, and at the same time, they are electrically connected with the vias (not shown in the figure), which are provided within the sub-mount 27. The vias are electrically connected with the electrode pads 22, which are formed on the surface of the sub-mount, opposite to that, on which the optical devices are mounted. Thus, the electrodes of the optical devices 2, after being mounted thereon, have such structure that they are electrically connected with the electrode pads 22 on the surface of the sub-mount 27.

Next, the sub-mount 27 is mounted on the electronic circuit board 1. According to the present embodiment, the solder 26 is applied. Of course, it does not matter to mount it with applying the adhesive, like the embodiment 1. Thereafter, although it is built up through the similar processes to those shown in the embodiment 1; however, in the present embodiment, the optical devices 2 substitute the sub-mount 27. Namely, the bumps 24 are formed on the electrode pads on the surface of the sub-mount, and the filet-like resins 25 are formed on the side walls of the sub-mount 27 and also on the side walls of the bumps 22 on the sub-mount 27.

With adopting such structure, in addition to the merit mentioned above, a degree of freedom increases in a testing process of the optical device or in a method for handling, and therefore, increasing the productivity further.

Figure 12:
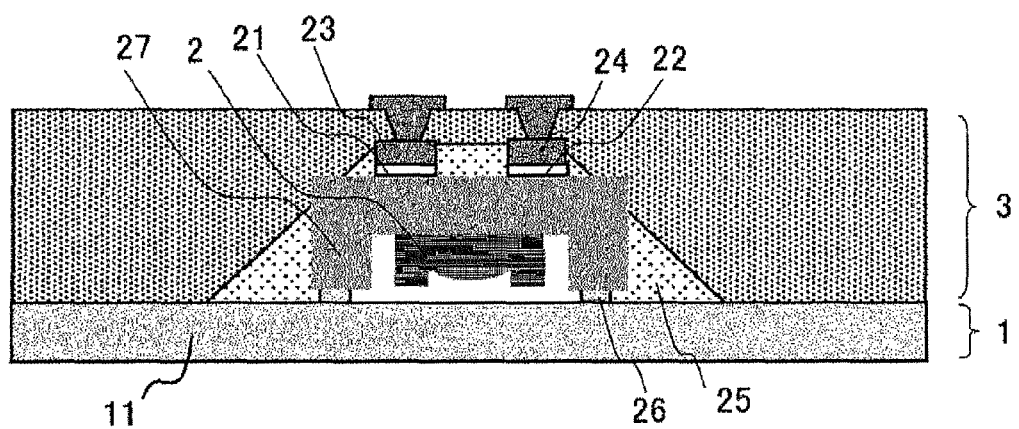
FIG. 12 is a schematic diagram for showing the fourth embodiment according to the present invention.
Figure 13:
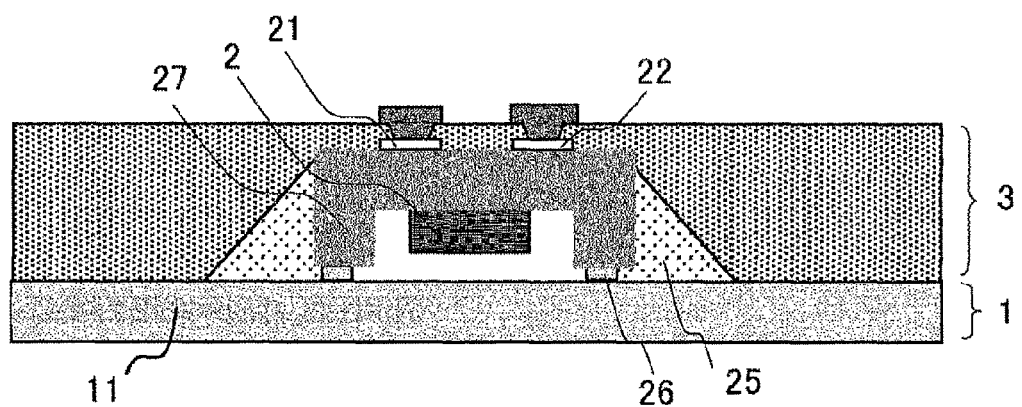
FIG. 13 is a schematic diagram for showing the fourth embodiment according to the present invention.
Figure 14:
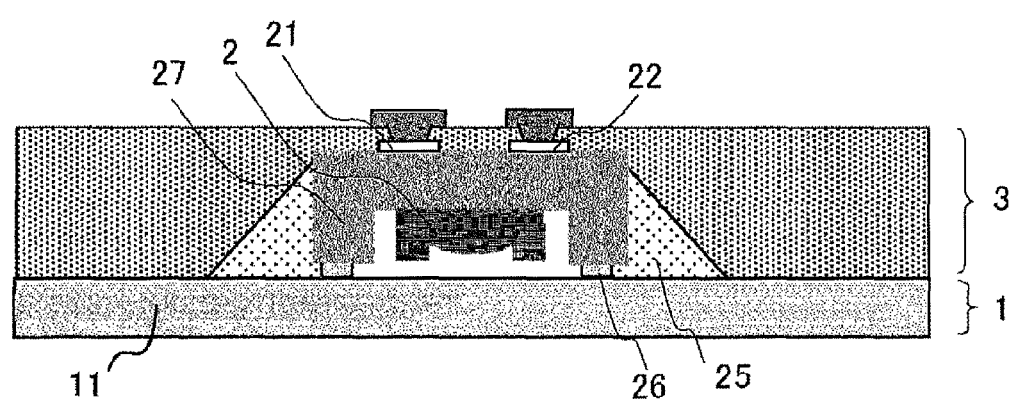
FIG. 14 is a schematic diagram for showing the fourth embodiment according to the present invention.

In relation with the present embodiment, it is possible to apply the optical device having the lens 2c. The configuration of that is shown in FIG. 12. With the structure of forming the metalizing of sub-mount 17, on a mounting surface onto the electronic circuit board 1, to cover over an entire periphery thereof, a space defined between the lens and the surface of the electronic circuit board becomes the air layer, and it is possible to prevent the resin 25 from invading therein. Also, it does not matter to adopt such structure that the electrode pads without bump are formed on the surface of the sub-mount 27 and the resin 25 is applied only on the side surfaces of the optical devices.

Embodiment 5

Figure 15:
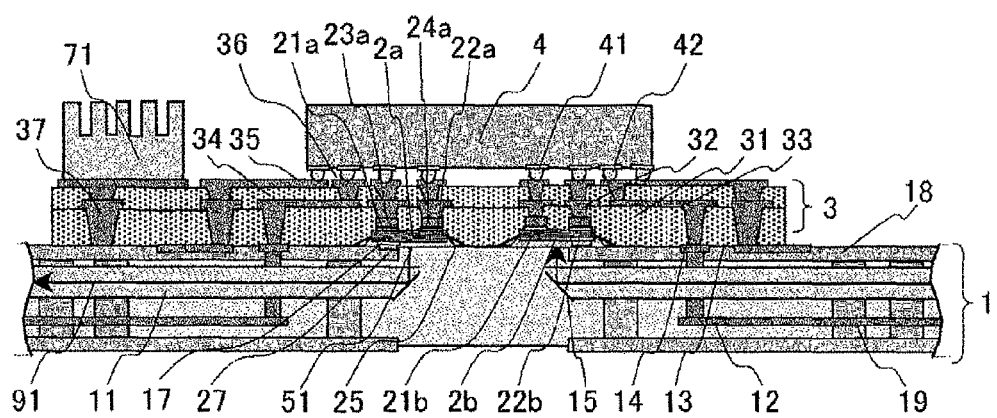
FIG. 15 is a schematic diagram for showing a fifth embodiment according to the present invention.

Next, explanation will be given on a fifth embodiment, according to the present invention, by referring to FIG. 15. In the embodiments 1 to 4, heat radiation of the optical devices 2 is achieved, mainly, by the bumps 21, which are connected with the electrodes of the optical devices 2, and the electric wirings of the wiring layer 3; however, in the present embodiment, there is provided the structure for achieving the heat radiation of heat generation from the optical devices 2, at an efficiency higher much more. First of all, in vicinity of the circuit board 1, where the optical devices are mounted, are formed conductor pads 17. The optical devices 2a and 2b are mounted on those conductor pads 17. As a method of connection, for the purpose of improving heat radiation characteristic, a bonding material having high heat conductivity is applied. In the present embodiment, the solder is applied. On a side of the optical device facing to the circuit board is provided a metal pad, a surface of which is made of Au, to be connected the solder thereon. The conductor pads 17 are connected with the conductor layer 18, which is formed widely on the surface layer of the electronic circuit board 1, and this conductor layer 18 extends up to a periphery or an end of the board 1, thereby achieving a roll as a heat spreader. Also, the conductor layer 18 is connected with a heat-radiation vias 19 formed in the circuit board 1, i.e., the circuit board has such structure that it can radiate the heat to a lower side thereof. Further, the conductor layer 17 is also connected with the vias for use of heat radiation, which are formed in the thin-film wiring layer 3, i.e., having such structure of conducting the heat to this. The vias 37 for use of heat radiation are connected with a heat radiation fin 71 on the surface layer of the thin-film wiring layer, through a bonding material having high heat conductivity, such as, the solder, i.e., the heat radiation is also made from this portion. With this, the heat generation from the optical devices is radiated at high efficiency, and the operation characteristics of the photoelectric fusion wiring module comes to be stabile.

According to the present embodiment, as heat radiation paths are provide three (3) routes, i.e., the conductor layer (e.g., the end portion of the board), the heat radiation vias 19 of the circuit board, and the heat radiation vias 37 of the thin-film wiring layer; however it does not matter if adopting the structure of forming only one (1) or two (2) among of those, depending on an amount or volume of heat generation of the optical devices, etc. Further, the heat radiation fin 71 may be deleted from, or may be in other configuration, such as, a conductor block having no fin or a water-cooling jacket, etc., or may be formed in one body together with the cooling structure of the LSI 4.

Embodiment 6

Finally, explanation will be given on the configuration when the photoelectric fusion wiring module according to the present invention is applied into a transmission apparatus, by referring to FIG. 16. However, herein electric wirings of the circuit board 1 and a parent circuit board 82 are not shown in the figure, for the purpose of simplification.

Figure 16:
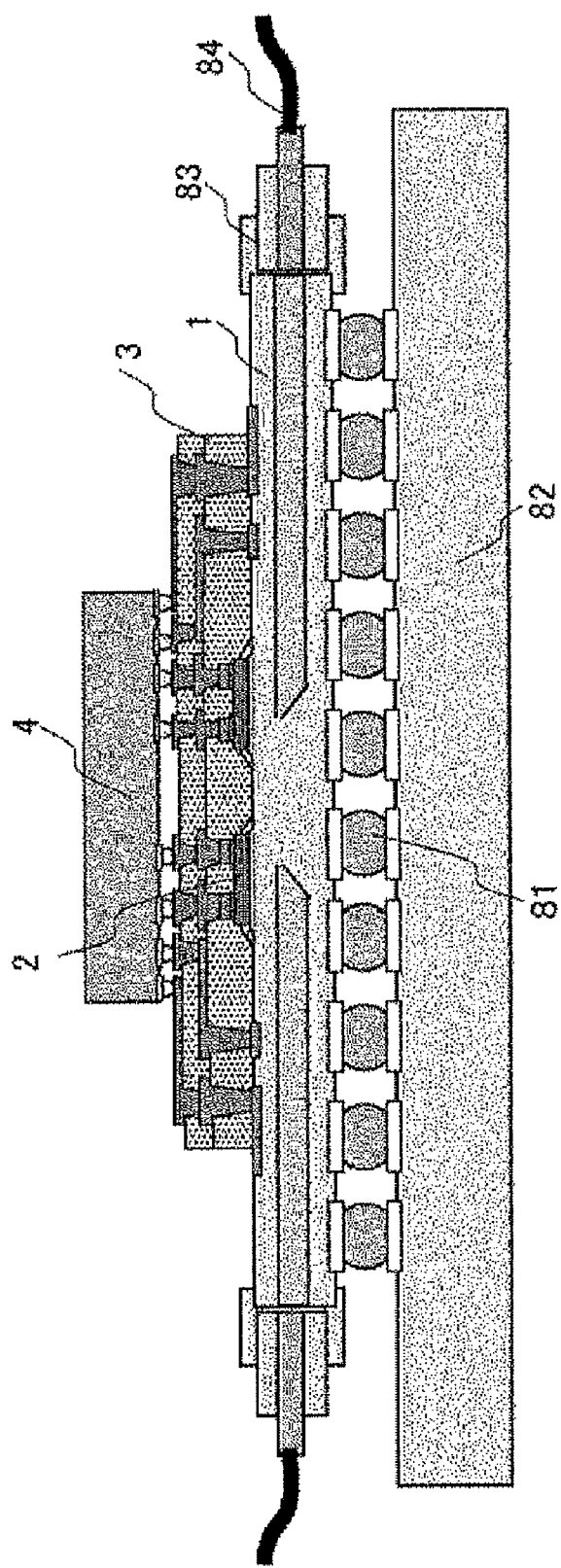
FIG. 16 is a schematic diagram for showing a sixth embodiment according to the present invention.

In FIG. 16, an input of electricity, such as, from a power circuit, etc., is provided from a reverse surface side of the circuit board 1. According to the present embodiment, the circuit board has such structure that it is connected with the parent circuit board 82 through the bumps by means of the solder bumps 81; however, this may be the configuration of inserting pins, or an electric connector. On the other hand, high-speed optical signal is connected by means of a optical connector 83. An optical signal from an outside is shown by an optical fiber 84, herein, however other than that is also applicable, such as, an optical guide film or a circuit board forming the optical path thereon, etc., for example.

However, in the present embodiment, although the configuration of the embodiment 1 shown in FIG. 1 is applied as the photoelectric composite wiring module; but, the configurations of those embodiments 2 through 5 other than that are also applicable therein.

APPLICABILITY IN INDUSTRIES

With implementation of the present invention, it is possible to achieve the photoelectric fusion wiring module and the transmission apparatus, enabling high-speed transmission and small power consumption, and also, having high reliability and high productivity.

EXPLANATION OF MARKS

1 . . . circuit board, 11 . . . optical guide, 12 . . . electric wiring of circuit board, 13 . . . surface layer of circuit board, 14 ... electrode pad of circuit board, 15 ... end portion of optical path (mirror of) 45°, 16 ... electrode pad, 17 ... conductor pad, 18 ... conductor layer, 19 ... heat radiation via of circuit board, 2 ... optical device, 2a ... light emitting element (surface light emitting type semiconductor laser), 2b ... light receiving element (surface incident type photo diode), 21a, 21b, 22a and 22b ... electrodes of optical devices, 23a, 23b, 24a and 24b ... stud bumps, 3 ... thin-film wiring layer, 31, 34 ... thin-film insulation layer of thin-film wiring layer, 32 ... via of thin-film wiring layer, 33, 35 ... electric wiring layer of thin-film wiring layer, 36 ... electrode pad of thin-film wiring layer, 37 ... heat radiation via of thin-film wiring layer, 4 ... LSI, 41 ... electrode pad of LSI, 42 ... bonding bump of LSI, 51 ... adhesive, 52 ... resin, 6 ... second circuit board, 62 ... insulation substrate of second circuit board, 62, 62 ... wiring of second circuit board, 64 ... through hole of second circuit board, 65 ... solder, 71 ... heat radiation member (heat radiation fin), 81 ... solder bump, 82 ... parent circuit board, 83 ... optical connector, 84 ... optical transmission path (optical fiber), 91 ... optical signal.

What is claimed is:

1. A photoelectric composite wiring module, comprising:
   a circuit board having an optical guiding path for transmitting an optical signal;
   an optical device, being provided on said circuit board, for optically coupling with said optical guiding path;
   an insulation film being provided on said circuit board and said optical device;
   a wiring pad being provided on said insulation film;
   electric wiring for electrically connecting said optical device and said wiring pad; and
   a semiconductor element being provided on said wiring pad and electrically connected therewith, wherein
   a filet-like resin is provided on a side surface of said optical device, and
   said insulation film is made up with an insulation film provided on said circuit board and said filet-like resin.

2. The photoelectric composite wiring module, as is described in the claim 1, further comprising
   an electrode pad on said optical device and a bump for connecting said electric wiring, wherein
   on a side surface of said bump is provided said filet-like resin.

3. The photoelectric composite wiring module, as is described in the claim 1, wherein
   said filet-like resin is a resin obtained by hardening a liquid state resin after applying it on the side surface of said optical device, and
   said insulation film is a film stuck on said circuit board and said filet-like resin.

4. The photoelectric composite wiring module, as is described claim 1, wherein
   said optical device is adhered on said circuit board through adhesive,
   said adhesive contacts on a light emitting surface or a light receiving surface of said optical device, and is transparent to the light to be emitted or received, and
   said filet-like resin is not transparent to said light.

5. The photoelectric composite wiring module, as is described in claim 1, wherein
   said optical device has a lens on a surface thereof, facing to said board.

6. The photoelectric composite wiring module, as is described in claim 1, wherein
   said filet-like resin is a resin comprising any one of a silicon of methyl group, a silicon of phenyl group, and a hybrid resin of silicon and epoxy, as a main component.

7. The photoelectric composite wiring module, as is described in claim 1, wherein
   said optical device is provided on said circuit board, having a surrounding metalizing or adhesive on a surface facing to said circuit board, and
   between said optical device and said circuit board is defined an air layer, on an interior side of said surround metalizing or adhesive.

8. The photoelectric composite wiring module, as is described in claim 1, wherein
   said optical device comprises a recess-shaped sub-mount, and an element for light emitting or light receiving, which is provided within said recess.

9. A method for manufacturing a photoelectric composite wiring module, comprising the followings steps of:
   a step for providing an optical device on a circuit board having a optical guide thereon, so that said optical device is optically coupled with said optical guide;
   a step for applying resin on said circuit board and further on a side surface of said optical device, and hardening it;
   a step for forming an insulation layer by sticking a film-like insulation film on said circuit board and said resin hardened;
   a step for forming wiring pads to be electrically connected with said optical device, on said insulation layer; and
   a step for connecting a semiconductor element on said wiring pads.

10. The method for manufacturing a photoelectric composite wiring module, as described in the claim 9, wherein
    said optical device has bumps thereon; and
    said resin is applied on the side surface of said optical device and on side surfaces of said bumps, and hardened.

11. The method for manufacturing a photoelectric composite wiring module, as described in the claim 9, wherein
    said resin sheet is formed by compressing said resin sheet to adhere, under a B stage condition thereof, and thereafter hardening fully.

12. A transmission apparatus, comprising:
    a photoelectric composite wiring module, as is described in claim 1, wherein
    said optical guide is optically coupled with an optical guide in an outside of the module, at an end portion thereof not being optically coupled with said optical device, through an optical connector, and
    the electric wirings of said circuit board is electrically connected with electric wirings in the outside of the module.

* * * * *